United States Patent
Cho et al.

(10) Patent No.: US 8,922,959 B2
(45) Date of Patent: Dec. 30, 2014

(54) SAFETY COMPONENT BY FUSE AT HIGH VOLTAGE BATTERY SENSING LINE

(75) Inventors: Sei Hoon Cho, Gyeonggi-do (KR); Soo Yeup Jang, Daejeon (KR); Young Lim Choi, Daejeon (KR); Sang Hyuck Kim, Daegu (KR)

(73) Assignee: SK Innovation Co., Ltd. (KR)

( * ) Notice: Subject to any disclaimer, the term of this patent is extended or adjusted under 35 U.S.C. 154(b) by 31 days.

(21) Appl. No.: 13/704,359

(22) PCT Filed: Jun. 16, 2011

(86) PCT No.: PCT/KR2011/004421
§ 371 (c)(1),
(2), (4) Date: Jan. 9, 2013

(87) PCT Pub. No.: WO2011/159112
PCT Pub. Date: Dec. 22, 2011

(65) Prior Publication Data
US 2013/0100563 A1    Apr. 25, 2013

(30) Foreign Application Priority Data

Jun. 17, 2010  (KR) .................. 10-2010-0057434

(51) Int. Cl.
*H02H 9/04* (2006.01)
(Continued)

(52) U.S. Cl.
CPC .............. *H02H 3/08* (2013.01); *H01M 10/482* (2013.01); *H01M 2200/103* (2013.01); *B60L 3/0046* (2013.01); *H01M 2/34* (2013.01); *H01M 2200/106* (2013.01); *G01R 31/3658* (2013.01); *H01M 2010/4271* (2013.01); *Y02T 10/7077* (2013.01); *B60L 11/14* (2013.01); *H01M 10/425* (2013.01); *B60L 2210/40* (2013.01); *Y02T 10/7241* (2013.01)
USPC ............................ 361/23; 361/91.1

(58) Field of Classification Search
USPC ........................ 361/23, 86, 87, 91.1
See application file for complete search history.

(56) References Cited

U.S. PATENT DOCUMENTS

| 8,203,312 B2 * | 6/2012 | Yoshikawa .................... 320/136 |
| 2009/0051324 A1 * | 2/2009 | Nakatsuji ...................... 320/134 |
| 2010/0121511 A1 * | 5/2010 | Onnerud et al. ................ 701/22 |

FOREIGN PATENT DOCUMENTS

| JP | 1996116602 | 5/1996 |
| JP | 2000077056 | 3/2000 |
| JP | 2000357541 | 12/2000 |

(Continued)

OTHER PUBLICATIONS

International Search Report—PCT/KR2011/004421 dated Feb. 6, 2012.

*Primary Examiner* — Danny Nguyen
(74) *Attorney, Agent, or Firm* — Cantor Colburn LLP

(57) ABSTRACT

The apparatus for preventing a secondary accident by short of sensing lines in a high voltage battery using a fuse, includes: a plurality of battery modules provided with a plurality of battery cells; a battery pack including a plurality of battery modules; a battery management system (BMS) for monitoring and controlling voltage of each battery cell provided in each battery pack to monitor the status of each battery cell; sensing lines connected between the battery module and the battery management system to sense voltage of each battery cell of each battery pack; and a passive safety device to be connected in series to a terminal of each battery cell provided in each battery pack when a short accident that a closed circuit is formed in the sensing line occurs.

5 Claims, 1 Drawing Sheet

(51) Int. Cl.

*H01M 10/48* (2006.01)
*B60L 3/00* (2006.01)
*H01M 2/34* (2006.01)
*H02H 3/08* (2006.01)
*B60L 11/14* (2006.01)
*G01R 31/36* (2006.01)
*H01M 10/42* (2006.01)

(56) References Cited

FOREIGN PATENT DOCUMENTS

| | | |
|---|---|---|
| JP | 2010025925 | 2/2010 |
| KR | 100867834 | 11/2008 |
| KR | 1020090129212 | 12/2009 |
| KR | 1020100062200 | 6/2010 |
| WO | 2010008026 | 1/2010 |

\* cited by examiner

US 8,922,959 B2

SAFETY COMPONENT BY FUSE AT HIGH VOLTAGE BATTERY SENSING LINE

TECHNICAL FIELD

The present invention relates to an apparatus for preventing a secondary short of sensing lines in a high voltage battery using a fuse, more particularly, to a secondary short preventing apparatus in sensing lines of a high voltage battery using a fuse that is connected between a battery module and a battery management system to prevent secondary and tertiary accidents by connecting passive safety devices such as a fuse and a positive temperature coefficient (PTC) to sensing lines, which checks a voltage value of battery cells, in parallel in occurring of short that a closed circuit is formed in the sensing line.

BACKGROUND ART

Automobiles with internal combustion engines (IC engines) which use gasoline or diesel as main fuel significantly affect on environmental pollution such as air pollution. Thus, there has been a great effort on development of electric or hybrid vehicles in order to reduce environmental pollution.

Recently, high power secondary batteries using non-aqueous electrolyte with high density energy are under development. A secondary battery with a large-volume is formed of multiple high power secondary batteries in serial connection to be used in a device such as an electric vehicle that requires high power for driving a motor. Therefore in general, one large-volume secondary cell, which is called "battery" hereinafter, is formed of multiple secondary batteries in serial connection.

Especially for batteries for Hybrid Electric Vehicle (HEV), several or sometimes several hundreds of secondary cells are recharged and discharged in turn and it needs to make batteries keep the optimum status by controlling recharge-discharge systems.

For this, a Battery Management System (BMS) is provided to control overall conditions of the battery. BMS estimates System-on-Chip (SOC) through operation by detecting voltage, current and temperature of batteries, and controls SOC to keep the best fuel efficiency of the vehicle.

HEV which uses high voltage battery is equipped with a system that automatically shuts off the power from the main high voltage battery when a state of emergency occurs.

The state of emergency refers to undue short-circuits and insulation breakdown caused by short that occurs by aging of related components or undue short-circuits and insulation breakdown by components destruction from external shocks. When the state of emergency occurs to the vehicle, upper components controlling high voltage such as BMS or Hybrid Control Unit (HCU) controls a power source by transmitting an order to shut main power off.

Components related to high voltage shut main power off through Controller Area Network (CAN) communication or signal transmission when voltage or current exceeding normal range is detected, when leakage current and insulation resistance destruction are found to be more than allowance during monitoring voltage and current in the line for connecting power through a series of program or sensors.

These conventional technologies for securing safety in relation to a large volume battery for electric vehicles are designed for cases that a battery is used as the main power, but still are not equipped with any device to secure safety from short of the sensing line which monitors the status of batteries.

As described above, the battery is formed of several cells connected in serial and parallel so that it could have the power and storage capability desired by users, and all these cells used are monitored through BMS and is designed to take proper actions to prevent any accident when such an accident occurs or is concerned to occur. The system is called 'active safety device'.

However, accidents do not always occur while the vehicle is under operation. Therefore, a device for preventing any accident occurring in a state that the vehicle is not under operation, i.e., a state that BMS is not started to operate, is required.

There are manual safety devices for this case. For example, provided are methods for attaching an auxiliary device to cut electrical connection off using the change of a battery s physical status, or mounting a large volume fuse on the main power line which provides electrical connection between a battery and an inverter. But for sensing lines, since a separate manual safety device is not prepared, there is a high possibility of a fire on sensing line when a short circuit accident occurs. Accordingly, the secondary fire (firing on the battery) and the tertiary fire (firing on the vehicle) are concerned to occur.

DISCLOSURE OF INVENTION

Technical Problem

The embodiment of the present invention invented to improve the conventional technology is to provide an apparatus for preventing a secondary accident by short of sensing lines in a high voltage battery using a fuse that prevents fire accident caused by short of the sensing line by attaching a passive safety device for sensing lines, which are connected between a battery module and a battery management system, to the place near a battery cell differently from the conventional technology that attaches a high-capacity fuse to a main power line for electrically connecting a battery and an inverter.

Solution to Problem

In order to solve the problem of the conventional technology, the apparatus for preventing a secondary accident by short of sensing lines in a high voltage battery using a fuse, includes: a plurality of battery modules provided with a plurality of battery cells; a battery pack including a plurality of battery modules; a battery management system (BMS) for monitoring and controlling voltage of each battery cell provided in each battery pack to monitor the status of each battery cell; sensing lines connected between the battery module and the battery management system to sense voltage of each battery cell of each battery pack; and a passive safety device to be connected in series to a terminal of each battery cell provided in each battery pack when a short accident that a closed circuit is formed in the sensing line occurs.

In the apparatus, the passive safety device is realized as a fuse or a positive temperature coefficient (PTC).

In the apparatus, the passive safety device is attached near the battery module.

The apparatus is applied to a vehicle using a lithium ion high voltage battery.

In the apparatus, the sensing line connected to each battery cell provided in each battery pack is formed of wires having a thickness of 0.5 sqmm or less since real current is too weak.

Advantageous Effects of Invention

An apparatus for preventing a secondary accident by short of sensing lines in a high voltage battery using a fuse according to an embodiment of the present invention is connected between a battery module and a battery management system (BMS) to prevent the secondary accident by short of sensing lines in a state that the engine of a vehicle does not operate, i.e., when the BMS does not operate, by connecting a passive safety device such as a fuse and a positive temperature coefficient (PTC) to sensing lines, which check a voltage value of battery cells, in parallel.

BEST MODE FOR CARRYING OUT THE INVENTION

The embodiment of the present invention will be described in detail with reference to accompanying drawings hereinafter.

Figure 1:
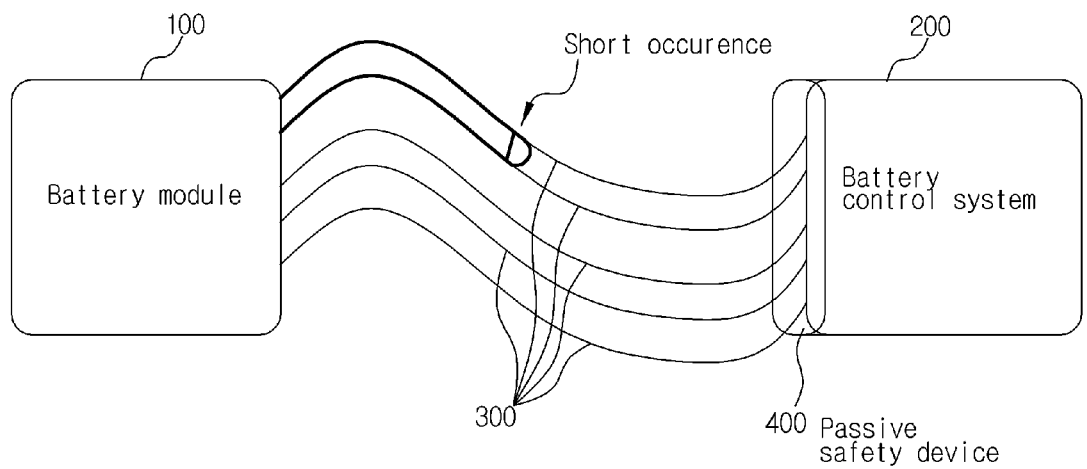
FIG. 1 shows a case that a passive safety device is attached according to the conventional technology.
Figure 2:
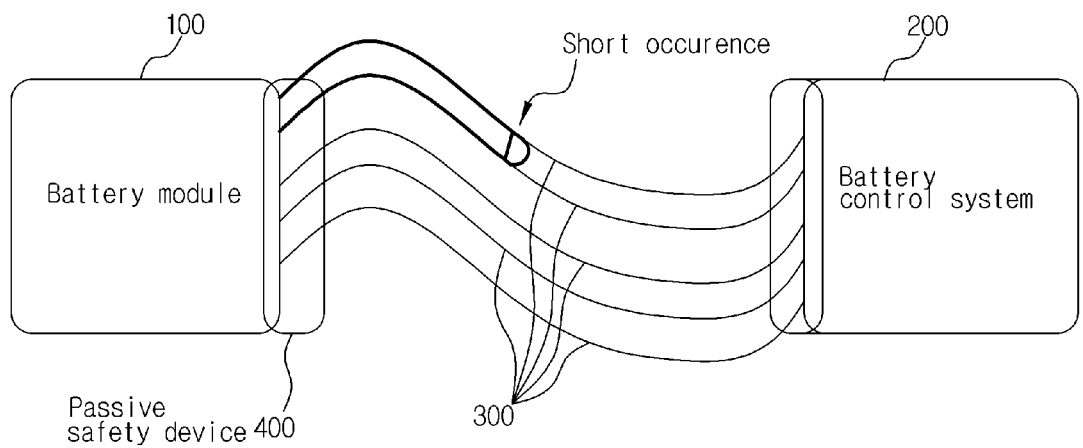
FIG. 2 shows a case that a passive safety device is attached in accordance with an embodiment of the present invention.

FIG. 1 shows a case that a passive safety device is attached according to the conventional technology. FIG. 2 shows a case that a passive safety device is attached in accordance with an embodiment of the present invention.

The secondary accident preventing apparatus by short of sensing lines in a high voltage battery using a fuse according to an embodiment of the present invention includes a battery module 100, a battery management system 200, sensing lines 300, and a passive safety device 400 as shown in FIG. 2.

Each of the battery modules 100 according to an embodiment of the present invention includes a plurality of battery cells. A battery pack includes a plurality of battery modules 100.

The battery management system 200 according to an embodiment of the present invention monitors and controls voltage of each battery cell provided in each battery pack to monitor the state of each battery cell of the battery pack.

The sensing line 300 connects the battery module 100 and the battery management system 200. The sensing line 300 senses voltage of each battery cell provided in each battery pack.

The sensing line 300 is connected to each battery cell of each battery pack. As described above, the battery pack, in which the battery cells are layered, is provided, and the battery management system 200 is located in a place spaced from the battery pack. Also, each battery cell of the battery pack is formed to be connected to the battery management system 200.

Accordingly, the battery management system 200 connected to the n battery cells through each sensing line 300 senses information of the n battery cells and controls the operation of the n battery cells. When the battery cells are connected to one battery management system 200, it is possible that the battery management system 200 senses voltage and temperature of each battery cell.

The number of sensing lines 300 is larger than the number of battery cells basically included in the battery. For example, when the number of battery cells included in the battery is 20, the number of sensing lines 300 is at least 21. Also, since the real current of the sensing line 300 is too weak, the sensing line 300 is formed of thin wire.

In the sensing line 300, several kΩ of resistances are connected to measure voltage of the battery cell. Accordingly, when the real current is weak, the sensing line 300 is formed of this wire having a thickness of 0.5 sqmm or less.

When a short accident occurs due to internal or external factors, a lot of currents flow in a moment. Since the current flows by forming a closed circuit not by a main power line for electrically connecting a battery and an inverter but by the sensing line 300, the fuse of the main power line is meaningless.

Occurring of secondary and tertiary fire accidents due to a primary short accident is prevented by connecting the passive safety device 400 such as a fuse and a positive temperature coefficient (PTC) to the sensing line 300.

The passive safety device 400 operates with occurring of a short accident that a closed circuit is formed in the sensing line 300 by direct connection with a terminal of each battery cell provided in each battery pack. The passive safety device 400 may be realized as a fuse or PTC.

As shown in FIG. 2, it is preferred that the passive safety device 400 is attached near the battery module 100. Since the short accident may occur in any point of the sensing line 300, it is efficient to attach the passive safety device 400 to the location near the battery cell.

When the passive safety device such as the fuse and PTC is connected in series between the battery module and the battery management system by the sensing line for checking the voltage value of the battery cell, the effect of the present invention that prevents the secondary and tertiary accidents by short of the sensing line in a state that the engine of a vehicle does not operate, i.e., when the BMS does not operate, may be obtained.

Although preferred embodiments of the present invention are described in detail above, it will be apparent that diverse modifications may be made without deviating from the basic concept and scope of the invention.

Therefore, the scope of the present invention is not limited to the above-mentioned embodiment but any equivalency of claims as well as claims themselves described here-in-below are intended to fall under the scope of the idea of the invention.

While a number of exemplary embodiments have been described with respect to certain preferred embodiments and drawings, it will be apparent that the present invention is not limited to the above embodiments and various changes and modifications may be made from the description by those skilled in the art. Thus, the idea of the invention should be construed by the claims themselves described here-in-below and it is understood that any equivalency or equivalent modifications of claims are intended to fall under the scope of the idea of the invention.

The invention claimed is:

1. An apparatus for preventing a secondary accident by short of sensing lines in a high voltage battery using a fuse, comprising:
    a battery pack including a plurality of battery modules, each battery module including a plurality of battery cells;
    a battery management system (BMS) for monitoring and controlling voltage of each battery cell provided in each battery module to monitor the status of each battery cell;
    sensing lines connected between the battery module and the battery management system to sense voltage of each battery cell of each battery module; and
    a passive safety device connected to the sensing lines and connected in series to a terminal of each battery cell of the battery module, wherein the passive safety device is configured to operate when a short accident that a closed circuit is formed in the sensing line occurs during the BMS being not operated.

2. The apparatus of claim 1, wherein the passive safety device is realized as a fuse or a positive temperature coefficient (PTC).

3. The apparatus of claim 1, wherein the passive safety device is attached near the battery module.

4. The apparatus of claim 1, which is applied to a vehicle using a lithium ion high voltage battery.

5. The apparatus of claim 1, wherein the sensing lines are formed of wires having a thickness of 0.5 sqmm or less.

* * * * *